United States Patent [19]

Keturakis et al.

[11] Patent Number: 5,057,767

[45] Date of Patent: Oct. 15, 1991

[54] OPTICAL COMMUNICATIONS LIGHT SHIELD FOR ENERGY METER

[75] Inventors: Andrius A. Keturakis, Portsmouth; Scott D. Velte, Rochester, both of N.H.

[73] Assignee: General Electric Company, Somersworth, N.H.

[21] Appl. No.: 505,970

[22] Filed: Apr. 5, 1990

[51] Int. Cl.$^5$ .............................................. G01R 13/04
[52] U.S. Cl. ...................................... 324/96; 324/156; 324/157
[58] Field of Search ................. 324/157, 96, 142, 156, 324/103 R; 250/239; 346/14 MR; 340/870.28; 361/366, 367, 368, 364, 372

[56] References Cited

U.S. PATENT DOCUMENTS

| | | | |
|---|---|---|---|
| 4,298,839 | 11/1981 | Johnston | 324/157 |
| 4,491,789 | 1/1985 | Benbow | 324/157 |
| 4,491,792 | 1/1985 | Bullock et al. | 324/157 |
| 4,491,793 | 1/1985 | Germer et al. | 324/157 |
| 4,584,527 | 4/1986 | Amigo | 324/157 |
| 4,783,623 | 11/1988 | Edwards et al. | 324/157 |
| 4,881,070 | 11/1989 | Burrowes et al. | 340/870.02 |

Primary Examiner—Kenneth A. Wieder
Assistant Examiner—Vinh P. Nguyen
Attorney, Agent, or Firm—Robert E. Brunson; Irving M. Freedman

[57] ABSTRACT

An optical communications shielded link assembly is provided from outside the cover of an electronic power meter to the register assembly without connecting cables and including an optical coupler on the exterior of the cover and an optical shroud assembly between the cover and a light emitter and detector positioned within the power meter around a light emitter and light detector. The optical shroud includes a spring loaded sleeve to fill the space between the cover and the register assembly and shield against ambient light. The sleeve includes projections moving within an annular slot with sufficient looseness to enable 3 axes positioning. Retaining and positioning means are provided for the components of the assembly. A detachable magnetic coupler can be connected to the cover mounted coupler or through a programming adapter detachably connected when the cover is removed.

53 Claims, 5 Drawing Sheets

FIG_1

FIG_2

FIG_3

FIG_4

FIG_5

FIG_6

FIG_7

FIG_13

FIG_14

FIG_15

OPTICAL COMMUNICATIONS LIGHT SHIELD FOR ENERGY METER

BACKGROUND OF THE INVENTION

The present invention relates to electric energy meters, and more particularly to the provision of an optical communications light shield in an optical communications link.

Present day electric energy meters and registers have greatly expanded capabilities and are being called upon to provide additional functions beyond simple indications of kilowatt hour consumption and kilowatt demand. Modern electric meters are often equipped with electronic time of use registers. These registers require a means to read time of use billing data acquired by, and stored in, the meter and also to provide for the programming of billing parameters. This is commonly achieved by means of an optical communications link. In previous designs this link was commonly implemented by mounting a light emitter and light detector in the transparent cover of the energy meter so that it could be read by the meter reader through use of a detachable magnetic coupler. The light emitter and light detector in such cover-mounted arrangements are connected to the register electronic circuitry by means of a cable extending between the cover and register electronics. Such an arrangement is cumbersome because the cable must be connected to the register assembly prior to the installation of the cover. Also, the cable makes it difficult to remove the cover in order to gain access to the inside of the meter for maintenance and service procedures, including access for the actuation of certain test switches frequently mounted on the meter face in electronic energy meters. In addition, power utilities commonly follow the practice of periodically washing meter covers in commercial type dishwashers. Such a practice can be difficult in the presence of cover mounted electronics, and can injure the electronic components. As a result, it is desirable to eliminate the cover mounted electronic components in electric energy meter while at the same time continuing to provide for the use of an optical communications link to access the register from outside the meter case to read the register and also to program billing parameters into the register. However, with such an arrangement it becomes necessary to provide good optical shielding from ambient light of the optical communications link, especially in meters mounted in direct sunlight.

OBJECTS AND SUMMARY OF INVENTION

It is an object of the present invention to provide an electric energy meter with an optical communication link without mounting electronic components on the cover.

It is another object of the present invention to provide an optical communications link for an electric energy meter which provides good optical shielding between the optical link and the register of the energy meter.

It is a further object of the present invention to provide an optical communications link for an electric energy meter which includes a minimum of parts, which is mounted, at least in part, on the cover of the meter, and which is readily assembled and placed into operation.

In one embodiment of the present invention a shielded optical communication link is provided between the transparent cover of an electronic energy meter and the light emitter and light detector positioned within the register assembly. An optical coupler configured to position and receive a detachable magnetic coupler is positioned on the outside of the cover and an optical shroud assembly is positioned between the coupler and the surface over the light emitter and light coupler. The optical shroud assembly prevents ambient light reaching the light emitter and light detector and includes a lubricated Nylon sleeve moving within a spring-loaded annular groove. The sleeve includes guides moving within axial slots with sufficient freedom to enable 3 axes positioning of the sleeve. The guides are readily inserted into the axial slots past a stop by compressing the resilient cantilever guide supports. Positioning and weather proof connections are provided for assembly of the optical communications link on the cover. A detachable programing adapter is provided for use when the cover is not on the energy meter to receive and shield the detachable magnetic coupler, enabling the electronics including the light emitter and light detector to be positioned on the energy meter and not on the cover.

In an alternate embodiment of the present invention, the optical coupler is attached to the outside of the transparent cover and the optical shroud assembly is positioned around the light emitter and light detector with the spring loaded nylon sleeve being forced against the bottom of the transparent cover adjacent the optical coupler. The optical coupler is of larger diameter than the optical shroud assembly and is formed from unitary magnetic steel.

Figure 1:
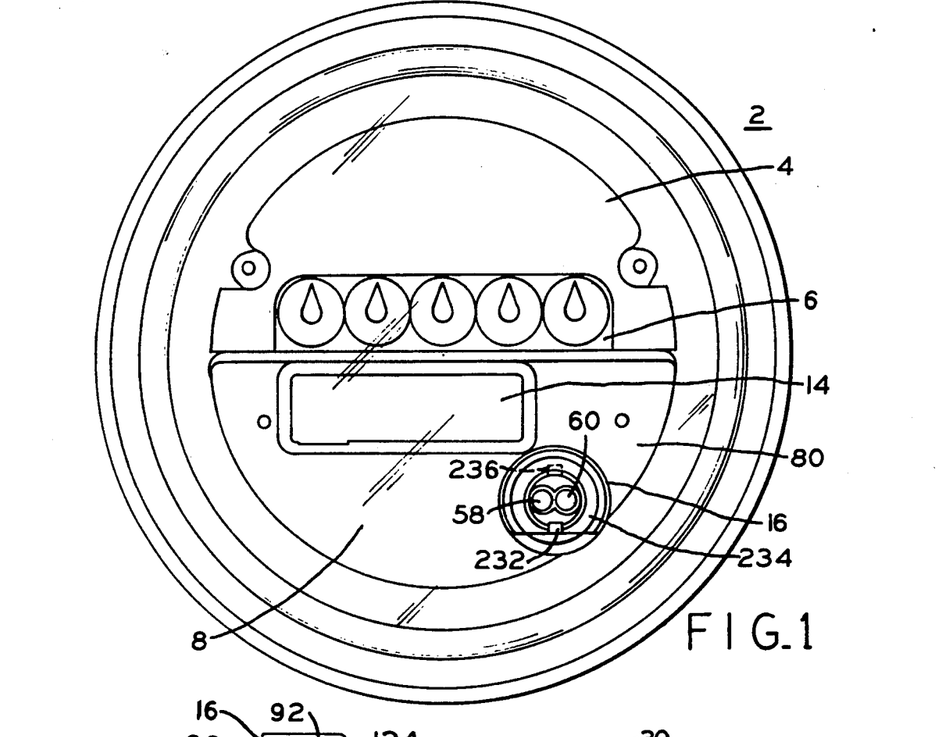
FIG. 1 shows a top view of an electric energy meter with an electronic register incorporating one embodiment of the present invention.
Figure 2:
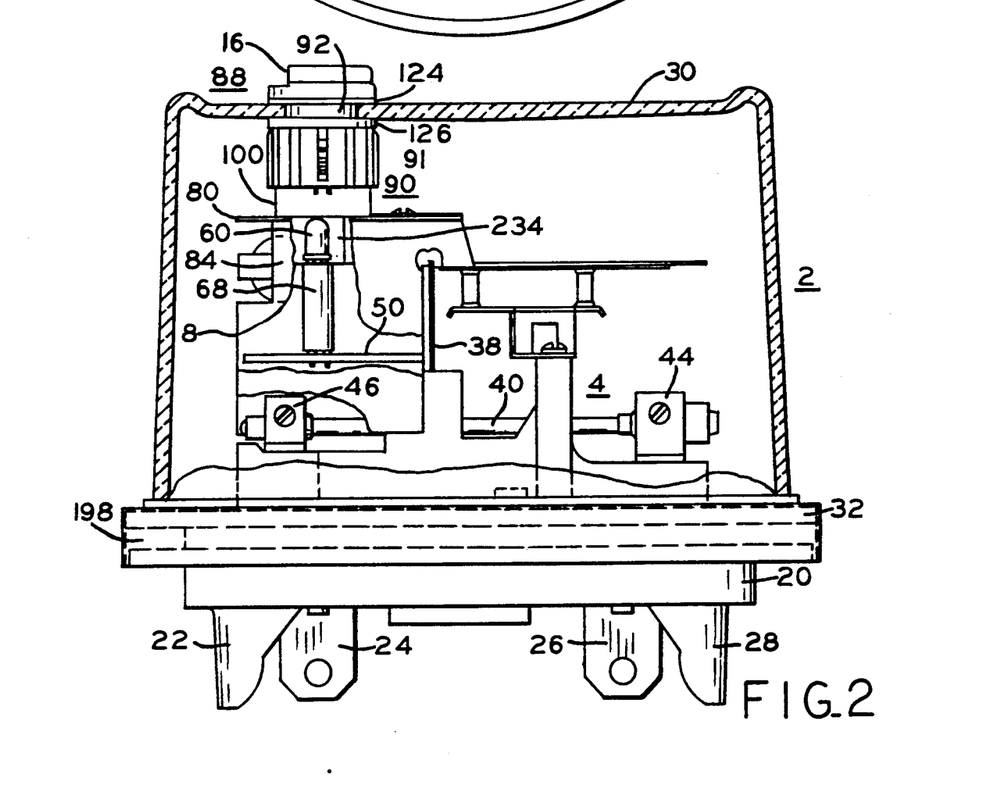
FIG. 2 is a side view of the energy meter of FIG. 1.

Referring first to FIG. 1, an electric energy meter 2 includes an induction watthour meter 4 with a dial readout assembly 6 and including an electronic register 8. The electronic register 8 includes a liquid crystal display (LCD) readout 14 and an optical coupler or port 16. As best shown in FIG. 2, the energy meter 2 includes a molded base 20 having a plurality of meter circuit terminals such a 24 and 26 extending through the base to connect the meter in circuit with a power source and a load which is to be metered. A transparent cover or housing 30 in combination with a ring clamp assembly 32 surrounds the meter components and in combination with the base 4 encloses the assembly. The transparent cover or housing 30 is commonly made of glass or a transparent polycarbonate such as Lexan, a trademark of General Electric Company.

In a manner well known in the art, the induction watthour meter 4 includes an eddy current disk 38 mounted on shaft 40 for rotation within bearings 44 and 46 responsive to the rate that energy is being used by a load connected in circuit with the terminals 24 and 26 of the electric energy meter 2. The dial readout assembly 6 (see FIG. 1) integrates or totalizes the revolutions of the eddy current disk 38 to provide an indication of kilowatt hour consumption of power by the load. The electronic register 8 provides a plurality of different information including the rate and time of use of electric power.

Figure 3:
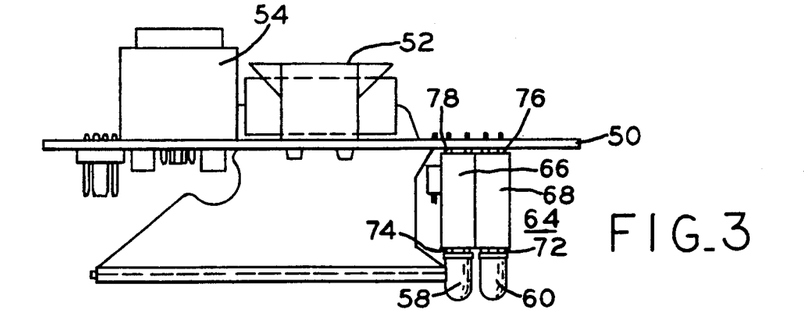
FIG. 3 shows the register circuit board incorporating the optical readout elements of the present invention.
Figure 4:
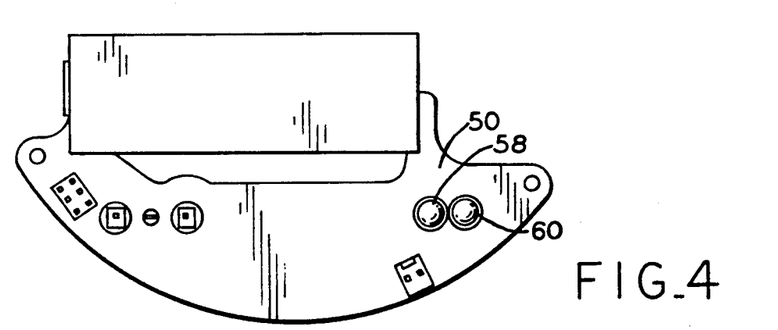
FIG. 4 is a bottom view of FIG. 3.

As shown in FIGS. 3 and 4, the register electronics include a register circuit board 50 upon which are placed the register electronic components including an optical disk sensing assembly 52 and a high voltage power supply transformer 54. The disk sensing optic assembly 52 is described in copending patent application Ser. No. 07/505,383 Pat. No. 5,034,682 of A. A. Keturakis, R. C. Mayo, and S. D. Velte, and the high voltage power supply transformer 54 is disclosed in copending patent applications Ser. No. 07/505,194 A. A. Keturakis, R. A. Balch, and S. D. Velte, both of which are assigned to the same assignee as the present invention, and are hereby incorporated by reference. The register circuit board also supports the light emitter 58 and light detector 60 which are part of the optical communications link 64. The light emitter 58 and light detector 60 of the optical communications link 64 are positioned within the cylindrical spacers 66 and 68 respectively which position and support the light emitter and light detector on the register printed circuit board 50. The light emitter 58 is a light-emitting diode. Four equally spaced projections such as 72 and 74, and 76 and 78, on each end of the cylindrical spacers 66 and 68 maintain the light emitter 58 and light detector 60 positioned away from the spacers, and also position the spacers away from the register printed circuit board 50. The electrical leads for the light emitter 58 and light detector 60 after passing through the spacers 66 and 68, respectively, are soldered to the register printed circuit board 50.

The register printed circuit board 50 is mounted within the register 8 of the electric energy meter 2 such that the light emitter 58 and light detector 60 are positioned within the housing of the register 8 with their tops positioned just below the name plate 80 (see FIGS. 1 and 2). The principal components of the optical communications assembly 88 are shown in FIG. 2. Referring to FIG. 2, the optical communications assembly 88 includes an optical coupler 16 positioned above and outside the transparent cover 30, and the optical shroud assembly 90 positioned inside the transparent cover and connected through an aperture 92 in the transparent cover.

Figures 5, 6, 7:
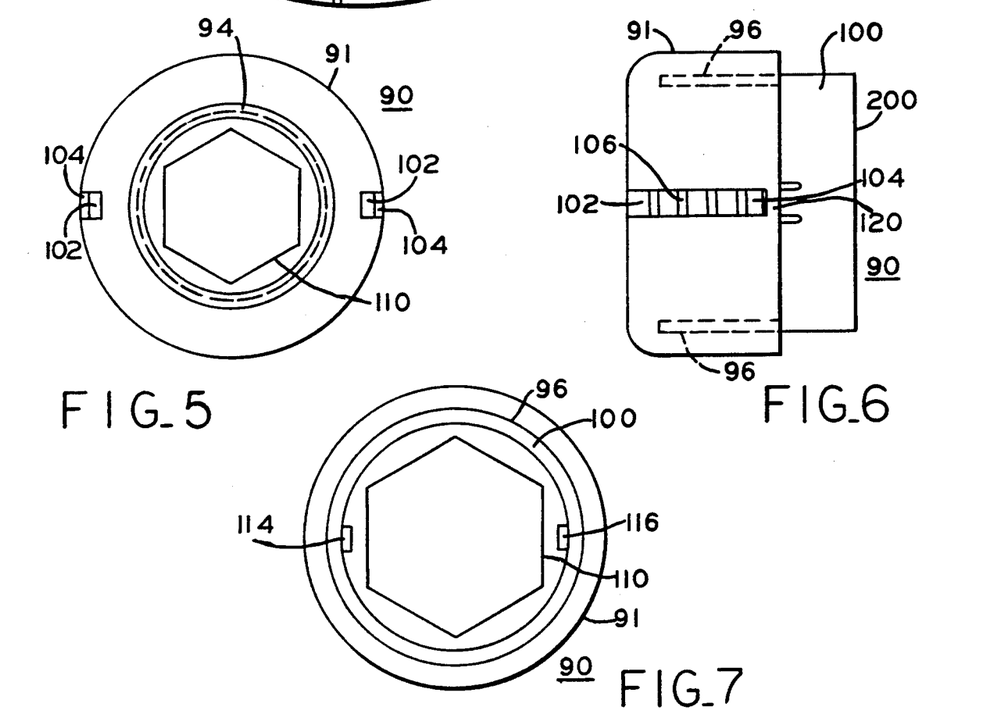
FIG. 5 is an enlarged view of the optical shroud assembly which is positioned inside the electric meter in FIG. 2.
FIG. 6 is a side view of FIG. 5.
FIG. 7 is a bottom view of FIG. 6.

The optical shroud assembly 90 is best shown in FIGS. 5, 6 and 7. Referring to FIGS. 5, 6 and 7, the optical shroud assembly 90 includes the interior threads 94 for fastening to the optical port 16 which extends through the aperture 92 and the transparent cover 30. A hexagonal tool is inserted into the hexagonal central aperture 110 to rotate and tighten the optical shroud assembly 90 to the threads on optical port 16. The optical shroud 90 includes an annular groove 96 (shown dotted in FIG. 6) in which the moveable shroud clip 100 is positioned as described in more detail below. A helical spring 106 is positioned within the annular groove 96 prior to the insertion of the shroud clip 100, such that the resiliency of the helical spring urges the shroud clip away from the molded body 91. However, the radially extending guides 104 on the shroud clip 100 slide within the diametrically opposed axial slots 102 in the molded body 91. The width of the annular groove 96 is slightly greater, namely 0.008 inches nominally greater, than the thickness of the shroud clip 100, and the width of the axial slots 102 are slightly greater, namely 0.010 inches nominally greater, than the width of the guides 104 on the shroud clip 100 such that there is sufficient room or looseness for the shroud clip to rotate slightly and "cock" angularly relative to the annular groove 96.

Also, it is to be noted that the axial slots 102 do not extend completely along the side of the molded body 91 such that the terminal rim portion 120 retains the resilient guides 104 in the axial slots once assembled. This allows the shroud clip 100 to conform to the surface of the nameplate 80 (see FIG. 2) even with the buildup of normal manufacturing tolerances within the energy meter 2 which results in variations in the distance and the angle between the top of the transparent cover 30 and the nameplate 80. This ability to provide at least limited movement about 3 orthogonal axes helps provide an effective shield against leakage of ambient light (from outside the transparent cover 30) reaching the light detector 60. The cover 30 and the ring clamp 32 are assembled to the base 20 by placing the cover upon the base and rotating the cover to obtain a locking action between the ring clamp 32 and projections in the base. During this assembly operation, the shroud clip 100 moves in an arc over the nameplate 80 toward being positioned above the light emitter 58 and light detector 60. The ability of the shroud clip 100 to conform to the shape and distance between the cover 30 and the nameplate 80, and provide an effective light shield in such an arrangement is a significant advantage provided by the optical shroud assembly 90 of the present invention.

The optical coupler 16 (as best shown in FIG. 2) is positioned outside the transparent cover 30 and extends through the cover for attachment to the optical shroud assembly 90. A cork washer or gasket 124 is positioned between the optical coupler 16 and the transparent cover 30, and a corresponding cork washer or gasket 126 is positioned between the transparent cover and the molded body 91 of the optical shroud assembly 90, such that when the two pieces are screwed together they compress the washers on either side of the transparent cover forming a weather-proof seal. In a preferred embodiment of the present invention, the gasket 126 includes a cork washer adjacent the transparent cover 30 and an inner thin metallic washer to assist in applying uniform and proper pressure to the cork washers 124 and 126. Details of the optical coupler 16 are best shown in FIGS. 8 and 9.

Figures 8, 9, 10, 11:
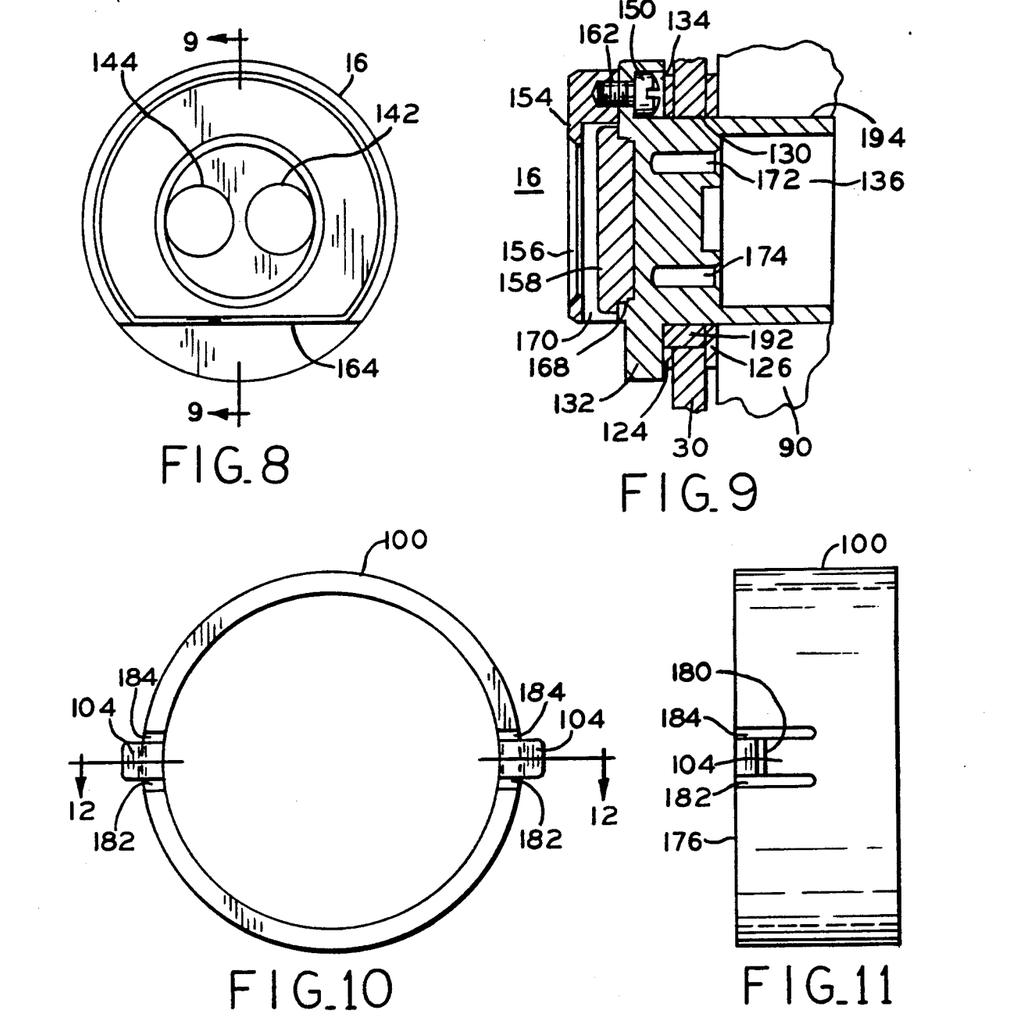
FIG. 8 is an enlarged .view of the optical coupler which is positioned outside and extending through the transparent cover of the electric meter in FIG. 2.
FIG. 9 is a cross-sectional view taken along the line 9—9 of FIG. 8.
FIG. 10 is an enlarged view of the optical shroud clip shown in FIGS. 6 and 7.
FIG. 11 is a side view of FIG. 10.

Referring to FIGS. 8 and 9, the optical coupler 16 includes a body 130 having an annular shoulder 132 which when installed overlies the transparent cover 30, and a central aperture 136. The body 130 of the optical coupler 16 also includes a pair of axial apertures 142 and 144 connected to the central aperture 136 under which the light emitter 58 and light detector 60, respectively, are positioned when the optical coupler is installed on the transparent cover of the electric energy meter 2 (also see FIG. 2).

A cover 154 for the optical coupler 16 is generally circular in shape with a flattened portion 164 (see FIG. 8), and is made from magnetic steel. The cover 154 of the optical coupler 16 includes 3 threaded holes such as 162 which are angularly spaced equally around the circumference and positioned to receive screws such as 150 which pass through the counter-bored holes such as 134 in the annular shoulder 132 of the body 130 to fasten the cover to the body 130, with a viewing window 158 positioned therebetween. The viewing window 158 is secured to a shoulder 168 of the body 130 by cement, threads, or other suitable means to provide a transparent yet weather-proof viewing port through the optical communications assembly 88 from the outside of the electric energy meter 2 to the light emitter 58 and light detector 60. The apertures 172 and 174 which extend axially from the central aperture 136 through part of the body 130 are molded integral with the body. A slot 170 is provided along the flatted portion 164 of the optical coupler 16 to enable use of a circular lens 158 which extends into the slot.

Figure 12:
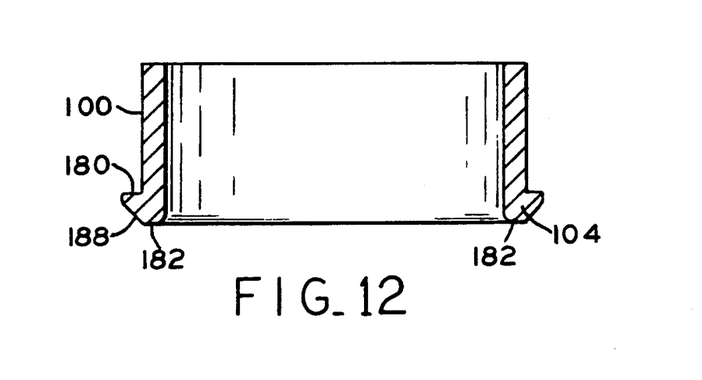
FIG. 12 is a cross-sectional view of FIG. 11 taken along the line 12—12 in FIG. 11.

The shroud clip 100 is readily assembled into the molded body 91 of the optical shroud assembly. FIGS. 10, 11 and 12 show the details of the shroud clip 100 which is shown in the assembled position in FIGS. 5, 6 and 7. Referring first to FIGS. 10, 11 and 12, the shroud clip 100 is generally annular in shape with a pair of diametrically opposed resilient guides 104. The resilient guides 104 extend from the shroud clip 100 at one end 176 and (as best shown in FIG. 12) include a tapered end portion 188, tapering outwardly from the annular body of the shroud clip 100 to a shoulder 180 which is substantially perpendicular to the shroud clip. The bottoms 182 of the resilient guides 104 are rounded and the resilient guides 104 (as best shown in FIGS. 10 and 11) are positioned between the axial slots 182 and 184 such that the resilient guides extend in a cantilevered fashion from the shroud clip 100 in the spaces formed by the axial slots. The shroud clip 100 is fabricated from a resilient lubricated plastic, such as lubricated Nylon, such that the cantilevered guides 104 are free to resiliently move within the spacers formed by slots 182 and 184.

In assembling the shroud clip 100 into the optical shroud assembly 90 (see FIGS. 6 and 7) the helical spring 106 is inserted into the annular groove 96 and the shroud clip 100 is positioned against the annular groove with the resilient cantilevered guides 104 adjacent slots 102. Simple manual pressure applied against the shroud clip 100 forces the resilient guides 104 past the rim portion 120 of molded body 91 by compressing the tapered portion 188 of the resilient guides 104 (see FIG. 12) inwardly until the tapered portion clears the rim portion of the molded body, whereupon the compressed tapered portion 188 of the resilient guides spring outwardly into the slots 102 to be moveable within the slots. The shoulder 180 contacting the rim portion 120 of the body 91 provides a stop for outward movement of the shroud clip 100. The inward compression of the resilient guides 104 during assembly of shroud clip 100 into annular groove 96 is accommodated by the relief slots 114 and 116 (see FIG. 7) which are positioned opposite axial slots 102 in the region of rim portion 120. The shroud clip 100 is now free to slide within the annular groove 96 in the axial direction. Since the width of the annular 96 is greater than the thickness of the shroud clip 100, and the width of the axial slots 102 are slightly greater than the width of the resilient guides 104, the shroud clip has a limited amount of freedom to rock or "cock" within the annular groove 96 and the slots 102.

The optical shroud assembly 90 is now ready for assembly to the optical coupler 16 on the transparent cover 30 as best shown in FIGS. 2 and 9. Referring to FIGS. 2 and 9, the assembled optical coupling 16 is inserted through aperture 92 and transparent cover 30. FIG. 9 shows the connection of the optical shroud assembly 90 and the optical coupler 16 through transparent cover 30. A positioning tab 192 molded integral with the body 130 of the optical coupler 16 is aligned with a mating aperture in the transparent cover 30 to provide proper angular alignment of the optical coupler on the cover. Cork washer 124 includes a cutout for positioning around tab 192 and is placed in position prior to insertion of the optical coupler 16 into the aperture 92 of the transparent cover 30. After insertion of the optical coupler 16 through the aperture 92 in the transparent cover 30, the gasket 126 is placed around the body 130 from inside the transparent cover and the optical shroud assembly 90 is then rotated for threading onto the external threads 194 surrounding the central aperture 136 of the body 130. This is accomplished by grasping and rotating the knurled outside of body 91 or using a hexagonal wrench inside hexagonal aperture 110 in body 91. When the optical shroud assembly and the optical coupler 16 are firmly secured about the transparent cover 30 they compress the cork washers 124 and 126 between them on either side of the transparent cover to provide a weather-proof passage and seal through the transparent cover.

The transparent cover 30 is now ready to be assembled onto the base 20 of the electric energy meter 2 through the cooperation of the ring clamp 32 (see FIG. 2). As the transparent cover 30 and ring clamp 32 are brought into contact with the base 20 of the electric energy meter 2, the shroud clip 100 of the optical shroud assembly 90 contacts the nameplate 80. Three spring clips spaced about the inside of ring clamp 32 are positioned within cutouts in a rim on molded base 20 and the transparent cover 30 is rotated until the spring clips are brought into engagement with the rim of molded base 20 and a stop, locking the transparent cover in place. The spring loaded shroud clip 100 contacts the nameplate 80 with varying degrees of pressure as it is slid across the nameplate while the transparent cover, and the optical communications assembly 88 secured to it are positioned, and locked in position, over the light emitter 58 and light detector 60.

During assembly, positioning the transparent cover 30 with the optical communications assembly 88 in proximity to the light emitter 58 and light detector 60, and subsequent rotation of the transparent cover, the lubricated Nylon shroud clip 100 conforms to and slides over the nameplate 80 until the optical communications assembly is properly positioned over the light emitter and light detector with the axial apertures 142 and 144 properly aligned over the light emitter 58 and light detector 60, respectively. The shroud clip 100 is able to slide axially within the annular groove 96 and provide slight angular or "cocking" movement such that pressure from the helical spring 106 positions the end 200 of the shroud clip 100 firmly against the nameplate 80. This completely shields the optical communications path and prevents ambient light from reaching the light emitter 58 or light detector 60 directly or through the region between the shroud clip 100 and the nameplate 80.

Optically protected remote access to the light emitter 58 and light detector 60 positioned within electronic register 8 of the electric energy meter 2 may now be accomplished through use of existing communications links such as the detachable magnetic coupler communications apparatus disclosed in U.S. Pat. No. 4,491,793 of W. R. Germer and A. W. Palmer, assigned to the same assignee as the present invention, and hereby incorporated by reference.

The present invention allows the shroud clip 100 to conform more closely to the nameplate 80 more closely than attempts to utilize a bellows arrangement in which the shielding from ambient light is less than that desired.

Figure 13:
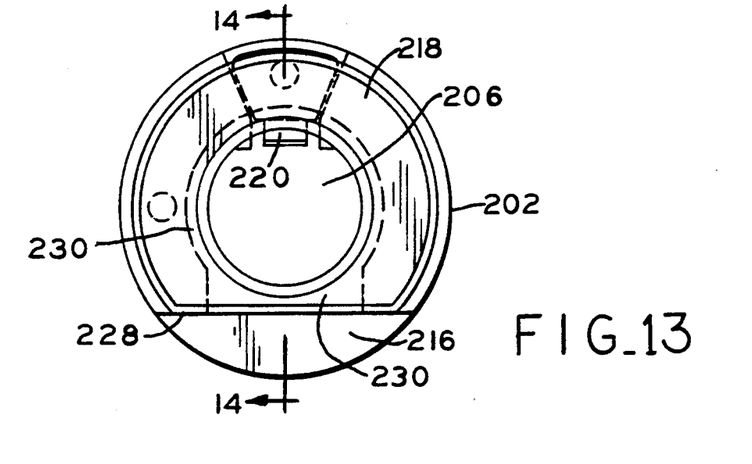
FIG. 13 shows a programming adaptor used in the present invention.
Figure 14:
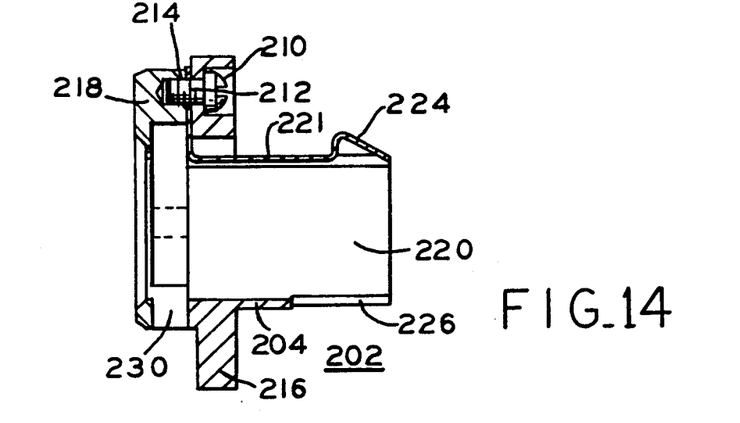
FIG. 14 is a cross-sectional view of FIG. 13, taken along line 14—14 in FIG. 13.
Figure 15:
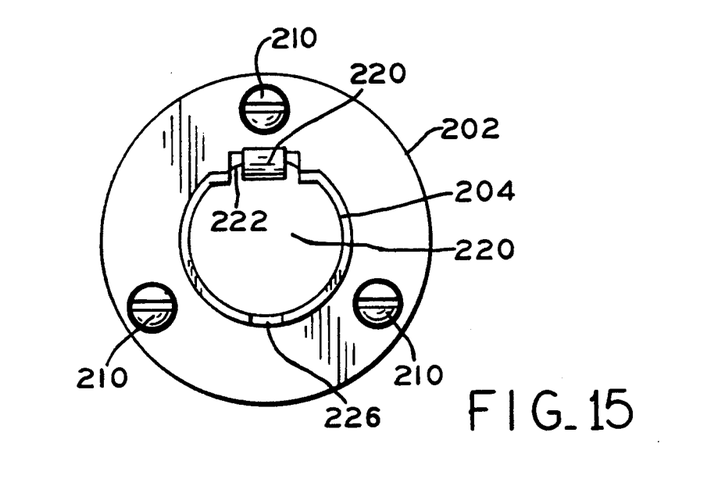
FIG. 15 is a bottom view of FIG. 13.

In the manufacture, repair, and maintenance of electronic registers utilizing the present invention, it is desirable to be able to access the optical data link without the necessity of having the transparent cover 30 assembled on the electric energy meter 2. This may be accomplished through use of a programming adapter. The programming adapter serves to hold the magnetic coupler in place and to shield the communications path from ambient light, in place of the optical communications assembly 88. Program adapter 202 is shown in FIGS. 13, 14 and 15. Referring to FIGS. 13, 14 and 15, the programming adaptor 202 includes a body 204 having a shoulder 216 to which is secured a cover 218 including a central aperture 206 aligned with the central aperture 220 of the tubular body 204. A spring clip 220 is placed between the shoulder 216 and the cover 218 and secured in place by one of the three equal angularly spaced screws 212 positioned in counter-bored holes 210 in shoulder 216, and screwed into the threaded holes 214 in the cover 218. The spring clip 220 is positioned within the axial slot 222 along the tubular body 204 and terminates in a projection 224 which extends outside the tubular body 204. A positioning slot 226 in the tubular body 204 is positioned diametrically opposite the axial slot 222 and provides angular positioning of the program adapter 202 on the electronic register 8 as described below. As best shown in FIGS. 13 and 14, the cover 218 of the program adapter 202 is generally annular with a flatted portion 228 and including an opening 230 through the flatted portion and surrounding the central aperture 206.

The programing adaptor 202 is readily applied to the electronic register 8 of the electric energy meter 2 by positioning the program adaptor above the light emitter 58 and light detector 60 (see FIGS. 1 and 2) with the positioning slot 226 aligned with the axially extending positioning rib 232 in the cavity 234 of enclosure 84. Pressing the tubular body 204 of the program adaptor 202 into the cavity 234 in the enclosure 84 forces the projection 224 on spring 221 inwardly until the slot 226 bottoms on the positioning rib 232, at which position the compressed projection 224 is, or has been, allowed to move out of groove 222 into a retaining pocket 236 in the enclosure 84 diametrically opposite to the positioning rib 232 in the cavity 234.

The optical program adaptor provides direct access to the light emitter 58 and the light detector 60 and serves to hold the magnetic coupler in place while shielding the communications path from ambient light. The optical program adaptor 202 provides the same physical configuration as the optical coupler 16 on the transparent cover 30 of the electric energy meter 2 for external optical coupling to the electronic register 8. However, the viewing window 158 in the optical coupler 16 is not necessary since the program adapter 202 is used only during programming or servicing, after which it is removed and the transparent cover 30 of the electric energy meter 2 is replaced before exposing the electric energy meter to the weather and environmental conditions encountered when the meter is installed and left unattended.

Thus, we have provided an optical communications assembly 88 which enables the placement of the optical communications light emitter 58 and light detector 60 along with its associated electronics on the electronic register 8 of the electric energy meter 2, and have provided an optical communications coupler for optical access through the transparent cover 30 without the need for connecting cables or conductors between the transparent cover and the electronic register which would increase complexity, decrease energy meter accessibility and provide problems in washing the covers. The light shroud assembly 90 firmly and properly adjusts to the surface of the register nameplate 80 to provide effective shielding of the communications path from ambient light, it is unobtrusive, may be readily washed along with the cover, and an adapter is provided to replace the cover mounted optical coupler when working on, or programming, the electronic register with the cover removed.

Figure 16:
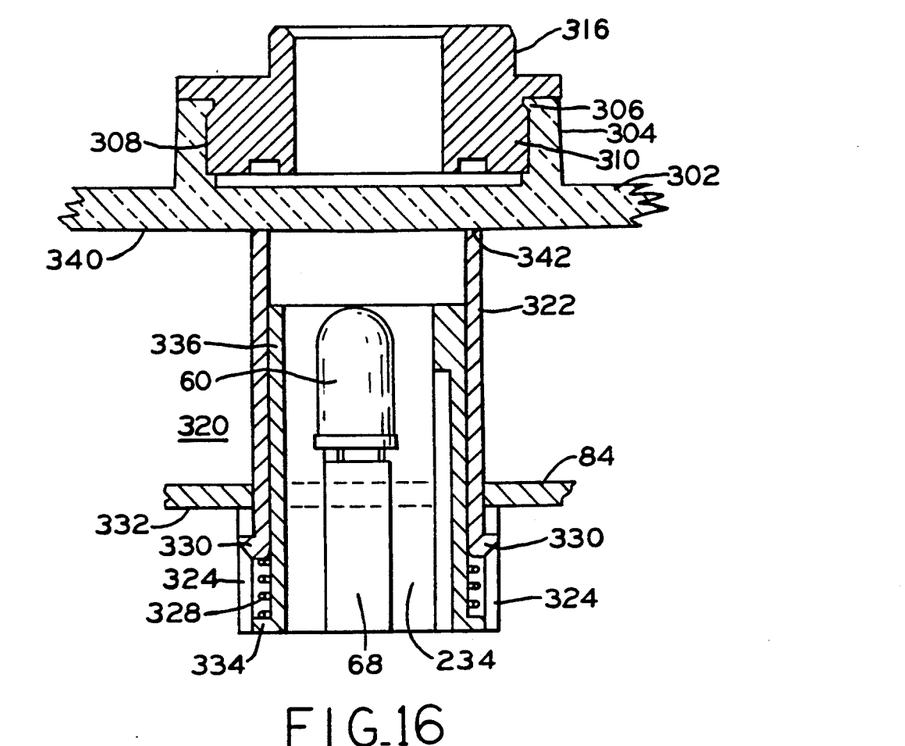
FIG. 16 shows an alternate embodiment of the present invention.

An alternate embodiment of the present invention is shown in FIG. 16 in which only a portion of the light shield assembly is mounted on the outside of the transparent cover, with a cooperating portion positioned inside the cover eliminating the need for an aperture 92 through the cover and the accompanying problems of weatherproofing the aperture. Referring to FIG. 16, the transparent polycarbonate cover 302 includes a tubular protrusion 304 which is molded integral with the transparent cover and positioned on the top of the transparent cover over the cavity 234, and light emitter 58 and light detector 60 in the register enclosure 84, when the cover is installed on the base 20 of the electric energy meter 2. The tubular protrusion 304 includes a retaining lip 306 to secure the optical coupler 316 within the cavity 308 formed by the tubular protrusion. The optical coupler 316 is generally configured the same as optical coupler 16 with the principal exceptions being that it does not include any portion extending through the transparent cover 302 along with associated gaskets, threads, and related components and is fabricated of magnetic steel in a unitary configuration. The magnetic steel facilitates the affixing of the detachable magnetic coupler. The optical coupler 316 is press fit into the cavity 308 by an ultrasonic stake procedure to be retained on the outside of the transparent cover 302. In lieu of the retaining lip 306, threads may be molded on the interior of the tubular protrusion 304 with matching threads on the exterior of the body 310 of the optical coupler 316 so that the optical coupler may be threaded into, and secured by, the interior threads on the tubular protrusion. When a glass cover 302 is utilized rather than a polycarbonate cover, an alternate procedure for attaching the optical coupler 316 to the outside of the cover is to fasten the optical coupler to the cover with an adhesive. An annular spot face conforming to the bottom of the optical coupler 316 is provided by an ultrasonic milling mill in the appropriate position prior to fastening the optical coupler to the cover.

The shroud assembly 320 is positioned within the transparent cover 302, and partially within the cavity 234 which contains the light emitter 58 and light detector 60. The shroud clip 322 is axially slidable about the tubular member 336 and is urged toward the transparent cover 302 by the coil spring 328 positioned between the bottom end of shroud clip 322 and the lip 334 of tubular member 336 which surrounds the light emitter 58 and light detector 60. Movement of the shroud clip 322 away from the register enclosure 84 is restrained by contact of the resilient guides 330 of the shroud clip with the inner surface 332 of the register enclosure.

The tubular member 336 is molded integral with the register enclosure 84 and includes axial slots 324 within which the resilient guides 330 are axially slidable. The resilient guides 330 are molded integral with the shroud clip 322 and are compressed and inserted into the axial slots 324 in the same manner as described above regarding the assembly of the resilient guides 104 into the axial slots 102 of the opticom shroud clip 100. Relief slots in tubular member 36 opposite the axial slots 324 accommodate the compression of the resilient guides 330 during assembly as described above regarding opticom shroud clip 100.

When the shroud assembly 320 is assembled onto the register enclosure 84, the coil spring 328 forces the shroud clip 322 up against the inner surface 332 of the register enclosure. When the transparent cover 302 bearing the optical coupler 316 is assembled onto the base 20 of the energy meter 2, the inner surface of the transparent cover will contact the outer edge 342 of the shroud clip 322 and force the shroud clip downward within the axial groove 324. In the assembled position the coil spring 328 forces the outer edge of the shroud clip firmly against the inner surface of the transparent cover, ensuring positive contact. The shroud clip 322 fits around tubular member 336 and within axial slot 324 with enough clearance to enable a slight cocking or angular tilt to the shroud clip when seated against the inner surface 340 of the transparent cover 302 which may be required to ensure a positive contact between the outer edge 342 of the shroud clip and the inner surface of the transparent cover. It is to be noted that the diameter of the optical coupler 316 is larger than the diameter of the shroud clip 322 such that ambient light which might be present around the outside of the optical coupler 316 and which may penetrate through the transparent cover 302 will not be directed through the shroud clip to the light detector 60. Thus, we have provided, in the alternate embodiment shown in FIG. 16, a less complex light shield including fewer parts and not requiring an aperture through the transparent cover 302 and associated problems of weather-proofing.

Thus, while the present invention has been described through preferred embodiments, such embodiments are provided by way of example only. Numerous variations, changes and substitutions, including those discussed above, will occur to those skilled in the art without departing from the scope of the present invention and the following claims.

What we claim is:

1. In an electronic energy meter having a cover and including means for external access to the interior of said energy meter through the cover by means of an optical communication link, an optical communications assembly interconnecting the exterior and interior of the energy meter, said optical communications assembly comprising:
   an optical shroud assembly positioned on the interior of said cover of said energy meter;
   an optical coupler positioned on the exterior of said cover of said energy means opposite said optical shroud assembly;
   a light emitter and a light detector positioned within an opening in said energy meter adjacent said optical shroud assembly;
   said optical shroud assembly including a moveable sleeve sliding within an annular groove in said optical shroud assembly; and
   means for urging said sleeve toward said light emitter and light detector to seal the open end of said opening within said energy meter against the entry of ambient light.

2. An optical communications assembly for an electric energy meter of claim 1 wherein said cover includes positioning means to position said optical communications assembly.

3. An optical communications assembly for an electric energy meter of claim 2 wherein said means urging said sleeve includes a resilient member positioned to exert pressure against said moveable sleeve tending to move said moveable sleeve toward said light emitter and light detector.

4. An optical communications assembly for an electric energy meter of claim 3 wherein said optical shroud assembly includes stop means for limiting the extent to which said moveable sleeve moves in said annular groove towards aid light emitter and light detector.

5. An optical communications assembly for an electric energy meter of claim 4 wherein said resilient member is a helical spring positioned and compressed in said annular groove, and said moveable sleeve includes one or more guides cooperating with one or more axial slots in said optical shroud assembly.

6. An optical communications assembly for an electric energy meter of claim 1 wherein said optical coupler is configured to receive a detachable magnetic coupler and includes one or more axial apertures cooperating with one ore more apertures in said optical shroud assembly to provide an optical path through said cover of said energy meter to said light emitter and said light detector within said electric energy meter.

7. An optical communications assembly for an electric energy meter of claim 6 wherein said optical coupler includes a transparent viewing window, a shoulder which seats against said cover, and a threaded member which extends through said cover to mate with threads in said optical shroud assembly.

8. An optical communications assembly for an electric energy meter of claim 7 wherein said optical coupler further includes a cover which is substantially annular in shape with a flatted portion adapted to orient said detachable magnetic coupler.

9. An optical communications assembly for an electric energy meter of claim 8 wherein said threaded member of said optical coupler includes an axially extending positioning rib to cooperate with a mating slot in said cover to angularly orient said optical coupler on said cover.

10. An optical communications assembly for an electric energy meter of claim 1 wherein a programming adapter is provided to connect an external detachable magnetic coupler to said electronic energy meter with said cover removed, said programming adapter including a tubular portion to surround said light emitter and said light detector.

11. An optical communications assembly for an electric energy meter of claim 10 wherein said programming adapter is configured to receive said detachable magnetic coupler while shielding out ambient light.

12. An optical communications assembly for an electric energy meter of claim 11 wherein said tubular portion includes means to angularly orient said adapter relative to said light emitter and light detector.

13. An optical communications assembly for an electric energy meter of claim 12 wherein said adapter includes a cover which is substantially annular in shape with a flatted portion adapted to orient said detachable magnetic coupler.

14. An optical communications assembly for an electric energy meter of claim 13 wherein said light emitter and light detector are positioned in a cavity in the housing of said energy meter which houses electronic circuitry, said housing including an axially extending positioning guide to angularly orient said adapter by cooperating with a mating positioning member on said adapter.

15. An optical communications assembly for an electric energy meter of claim 14 wherein said cavity in the housing of said energy meter further includes a retainer which cooperates with a resilient member on said adapter to detachably retain said adapter in said cavity.

16. An optical communications assembly for an electric energy meter of claim 15 wherein said retainer is a pocket in the wall of said cavity and said resilient member is a spring finger moving within a slot in said tubular portion and including an angular projection which extends into said pocket to detachably retain said adapter in said cavity.

17. An optical communications assembly for an electric energy meter of claim 16 wherein said means to angularly orient said adapter comprises an axial slot in said tubular portion of said adapter and an axial rib extending along the wall of said cavity in the housing of said energy meter.

18. In an electronic energy meter having a cover and including means for external access to the interior of said energy meter through the cover by means of an optical communication link, an optical communications assembly interconnecting the exterior and interior of the energy meter, said optical communications assembly comprising:

an optical shroud assembly positioned on the interior of said cover of said energy meter;

an optical coupler positioned on the exterior of said cover of said energy meter opposite said optical shroud assembly;

a light emitter and a light detector positioned within an opening in said energy meter adjacent said optical shroud assembly;

said optical shroud assembly including a moveable shroud sliding within an annular groove in said optical shroud assembly;

means for urging said moveable shroud toward said light emitter and light detector to seal the open end of said opening within said energy meter against the entry of ambient light;

said cover including positioning means to position said optical communications assembly;

said means urging said sleeve including a resilient member positioned to exert pressure against said moveable shroud tending to move said moveable shroud toward said light emitter and light detector; and said moveable shroud including one or more guides cooperating with one or more axial slots in said optical shroud assembly.

19. An optical communications assembly for an electric energy meter of claim 18 wherein said one or more guides on said moveable shroud include a projection which is configured to slide within one of said one or more axial slots which guides said moveable shroud in axial movement within said annular groove in response to pressure on the end of said moveable shroud which extends outside said axial slot.

20. An optical communications assembly for an electric energy meter of claim 19 wherein said one or more slots extend only part of the distance toward the end of said optical shroud assembly adjacent said light emitter and detector and forming in cooperation with said projections a stop for movement of said moveable shroud.

21. An optical communications assembly for an electric energy meter of claim 20 wherein said guides are resiliently connected to said moveable shroud, and said moveable shroud is positionable within said annular groove by compressing said resilient guides such that said projections thereon can pass beyond said stops into said axial slots.

22. An optical communications assembly for an electric energy meter of claim 21 wherein said guides are cantilevered and relief grooves are positioned opposite said axial slots on the side of said annular groove remote from said axial slots to facilitate compression of said resilient guides in order that said extensions may pass beyond said stops for expansion into said axial slots.

23. An optical communications assembly for an electric energy meter of claim 22 wherein said moveable shroud is lubricated plastic.

24. An optical communications assembly for an electric energy meter of claim 23 wherein said plastic is Nylon.

25. An optical communications assembly for an electric energy meter of claim 18 wherein said light emitter and said light detector are positioned within a cavity within the enclosure for the electronic register for said electric power meter, said enclosure including a substantially planar surface at the region proximate to the surface of said cover on which said optical coupler is positioned.

26. An optical communications assembly for an electric energy meter of claim 25 wherein said light emitter and said light detector are positioned within said cavity with the outer ends thereof adjacent said substantially planar surface.

27. An optical communications assembly for an electric energy meter of claim 26 wherein said moveable shroud is in contact with and is slidable over said substantially planar surface.

28. An optical communications assembly for an electric energy meter of claim 27 wherein the width of said axial groove is larger than the thickness of said moveable shroud enabling said moveable shroud to both move angularly and perpendicularly against said substantially planar surface.

29. An optical communications assembly for an electric energy meter of claim 28 wherein said moveable shroud includes one or more guides cooperating with one or more of said axial slots in said optical shroud assembly and the width of said slots are greater than the width of said guides enabling said moveable shroud to move angularly against said substantially planar surface in addition to movement about two other axes substantially orthagonally thereto.

30. An optical communications assembly for an electric energy meter of claim 29 wherein said movements of said moveable shroud against said substantially planar surface shields said light emitter and said light detector from ambient light.

31. An optical communications assembly for an electric energy meter of claim 30 wherein said cover of said energy meter is transparent.

32. An optical communications assembly for an electric energy meter of claim 31 wherein said optical coupler positioned on the exterior of said cover, and said optical shroud assembly positioned on the interior of said cover are connected together through a hole in said cover by a threaded member passing through said hole in said cover.

33. An optical, communications assembly for an electric energy meter of claim 32 wherein gaskets are provided around said threaded member to weather-proof the hole through said cover.

34. An optical communications assembly for an electric energy meter of claim 33 wherein a positioning slot adjacent said hole through said cover angularly orients said optical coupler on said cover.

35. An optical communications assembly for an electric energy meter of claim 34 wherein said optical coupler is configured to receive a detachable magnetic coupler, and includes one or more apertures in said optical shroud assembly to provide an optical path through said cover of said energy meter to said light emitter and said light detector within said electric energy meter.

36. An optical communications assembly for an electric energy meter of claim 35 wherein said optical coupler includes a transparent viewing window, a shoulder which seats against said cover, and a thread member which extends through said cover to mate with threads in said optical shroud assembly.

37. An optical communications assembly for an electric energy meter of claim 36 wherein said optical coupler further includes a cover which is substantially annular in shape with a flatted portion adapted to orient said detachable magnetic coupler.

38. An optical communications assembly for an electric energy meter of claim 37 wherein said threaded body of said optical coupler includes an axially extending positioning rib to cooperate with a mating slot in said cover to angularly orient said optical coupler on said cover.

39. An optical, communications assembly for an electric energy meter of claim 38 wherein said optical shroud is lubricated plastic.

40. An optical communications assembly for an electric energy meter of claim 39 wherein said plastic is Nylon.

41. An optical communications assembly for an electric energy meter of claim 40 wherein said gaskets include at least one compressible gasket positioned on either side of said cover, and the gasket positioned between said optical coupler and said cover includes a slot through which said axially extending positioning rib extends.

42. In an electronic energy meter having a transparent cover and including means for external access to the interior of said energy meter through the cover by means of an optical communication link, an optical communications assembly interconnecting the exterior and interior of the energy meter, said optical communications assembly comprising:
   an optical shroud assembly positioned on the interior of said cover of said energy meter;
   an optical coupler positioned on the exterior of said cover of said energy meter opposite said optical shroud assembly;
   a light emitter and a light detector positioned within an opening in said energy meter adjacent said optical shroud assembly;
   said optical shroud assembly including a moveable shroud sliding within said optical shroud assembly;
   means urging said moveable shroud to fill the space between said light emitter and light detector and said cover to shield said light emitter and light detector against the entry of ambient light;
   said cover including positioning means to position said optical communications assembly; and
   said moveable shroud includes one or more guides cooperating with one or more axial slots in said optical shroud assembly.

43. An optical communications assembly for an electric energy meter of claim 42 wherein said one or more guides on said moveable shroud each include a projection which is configured to slide within one of said one or more axial slots which guide said moveable shroud in axial movement.

44. An optical communications assembly for an electric energy meter of claim 43 wherein said shroud assembly is positioned at least in part within the housing of said energy meter, and said light emitter and light detector are positioned within said shroud assembly with said projections on said guides cooperating with said housing to provide a stop for movement of said moveable shroud.

45. An optical communications assembly for an electric energy meter of claim 44 wherein said guides are resiliently connected to said moveable shroud and said moveable shroud is positionable within said optical communications assembly by compressing said resilient guides such that said projections thereon can pass into said axial slots.

46. An optical communications assembly for an electric energy meter of claim 45 wherein said guides are cantilevered and relief grooves are positioned opposite said axial slots on the side of said annular groove remote from said axial slots to facilitate compression of said resilient guides in order that said extensions may be inserted for expansion into said axial slots.

47. An optical communications assembly for an electric energy meter of claim 46 wherein said moveable shroud is lubricated plastic.

48. An optical communications assembly for an electric energy meter of claim 47 wherein said plastic is Nylon.

49. An optical communications assembly for an electric energy meter of claim 42 wherein said moveable shroud includes one or more guides cooperating with one or more of said axial slots in said optical shroud assembly and the width of said slots are greater than the width of said guides enabling said moveable shroud to move angularly against said substantially planar surface in addition to movement about two other axes substantially orthagonally thereto.

50. An optical communications assembly for an electric energy meter of claim 49 wherein said optical coupler is configured to receive a detachable magnetic coupler, and includes one or more apertures in said optical shroud assembly to provide an optical path through said cover of said energy meter to said light emitter and said light detector within said electric energy meter.

51. An optical communications assembly for an electric energy meter of claim 50 wherein said optical coupler further includes a magnetic cover which is substantially annular in shape with a flatted portion adapted to orient said detachable magnetic coupler.

52. An optical communications assembly for an electric energy meter of claim 42 wherein said means urging said moveable shroud urges said moveable shroud toward said transparent cover to position the open end of said moveable shroud against the inside of said transparent cover.

53. An optical communications assembly for an electric energy meter of claim 52 wherein the diameter of said optical coupler is greater than the diameter of said moveable shroud.

* * * * *